(12) United States Patent
Booth et al.

(10) Patent No.: US 8,780,522 B2
(45) Date of Patent: Jul. 15, 2014

(54) CAPACITIVELY-COUPLED ELECTROSTATIC (CCE) PROBE ARRANGEMENT FOR DETECTING DECHUCKING IN A PLASMA PROCESSING CHAMBER AND METHODS THEREOF

(75) Inventors: Jean-Paul Booth, Essonne (FR); Douglas L. Keil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 302 days.

(21) Appl. No.: 12/498,939

(22) Filed: Jul. 7, 2009

(65) Prior Publication Data

US 2010/0008015 A1 Jan. 14, 2010

Related U.S. Application Data

(60) Provisional application No. 61/078,742, filed on Jul. 7, 2008.

(51) Int. Cl.
*H01L 21/683* (2006.01)
(52) U.S. Cl.
USPC .......................................................... 361/234
(58) Field of Classification Search
USPC .......................................................... 361/234
See application file for complete search history.

(56) References Cited

U.S. PATENT DOCUMENTS

| | | | |
|---|---|---|---|
| 4,595,487 A | 6/1986 | Nunlist | |
| 4,963,713 A | 10/1990 | Horiuchi et al. | |
| 4,982,067 A | 1/1991 | Marantz et al. | |
| 5,009,738 A | 4/1991 | Gruenwald et al. | |
| 5,175,472 A | 12/1992 | Johnson, Jr. et al. | |
| 5,473,162 A | 12/1995 | Busch et al. | |
| 5,936,413 A | 8/1999 | Booth et al. | |
| 6,024,831 A | 2/2000 | Hwang et al. | |

(Continued)

FOREIGN PATENT DOCUMENTS

| JP | 07-037817 A | 2/1995 |
|---|---|---|
| JP | 2001-144071 A | 5/2001 |

(Continued)

OTHER PUBLICATIONS

"International Preliminary Report on Patentability", Issued in PCT Application No. PCT/US2009/048747; Mailing Date: Jan. 13, 2011.

(Continued)

*Primary Examiner* — Rexford Barnie
*Assistant Examiner* — Ann Hoang

(57) ABSTRACT

A method for identifying a signal perturbation characteristic of a dechucking event within a processing chamber of a plasma processing system is provided. The method includes executing a dechucking step within the processing chamber to remove a substrate from a lower electrode, wherein the dechucking step includes generating plasma capable of providing a current to neutralize an electrostatic charge on the substrate. The method also includes employing a probe head to collect a set of characteristic parameter measurements during the dechucking step. The probe head is on a surface of the processing chamber, wherein the surface is within close proximity to a substrate surface. The method further includes comparing the set of characteristic parameter measurements against a pre-defined range. If the set of characteristic parameter measurements is within the pre-defined range, the electrostatic charge is removed from the substrate and the signal perturbation characteristic of the dechucking event is detected.

20 Claims, 13 Drawing Sheets

(56) References Cited

U.S. PATENT DOCUMENTS

| | | | |
|---|---|---|---|
| 6,165,311 | A | 12/2000 | Collins et al. |
| 6,218,312 | B1 | 4/2001 | Collins et al. |
| 6,291,072 | B1 | 9/2001 | Kimoto et al. |
| 6,440,260 | B1 | 8/2002 | Denda et al. |
| 6,447,691 | B1 | 9/2002 | Denda et al. |
| 6,833,710 | B2 | 12/2004 | Benveniste |
| 6,894,474 | B2 | 5/2005 | Cox et al. |
| 6,902,646 | B2 | 6/2005 | Mahoney et al. |
| 7,067,432 | B2 | 6/2006 | Xu et al. |
| 7,093,560 | B2 | 8/2006 | Tong et al. |
| 7,334,477 | B1 | 2/2008 | Pirkle |
| 7,374,636 | B2 | 5/2008 | Horioka et al. |
| 7,413,672 | B1 | 8/2008 | Keil et al. |
| 7,479,207 | B2 | 1/2009 | Kimball et al. |
| 7,994,794 | B2 | 8/2011 | Kimball et al. |
| 2001/0025691 | A1 | 10/2001 | Kanno et al. |
| 2002/0011213 | A1 | 1/2002 | Ramiah et al. |
| 2002/0024338 | A1 | 2/2002 | Saho et al. |
| 2002/0139478 | A1 | 10/2002 | Ma et al. |
| 2003/0038114 | A1 | 2/2003 | Howald |
| 2003/0210510 | A1 | 11/2003 | Hann et al. |
| 2004/0004708 | A1 | 1/2004 | Willis |
| 2004/0107906 | A1 | 6/2004 | Collins et al. |
| 2005/0032253 | A1* | 2/2005 | Hsu et al. ................ 438/17 |
| 2005/0103439 | A1 | 5/2005 | Goodman |
| 2005/0211384 | A1 | 9/2005 | Hayashi |
| 2005/0212450 | A1 | 9/2005 | Martinez et al. |
| 2006/0150913 | A1 | 7/2006 | Wang et al. |
| 2007/0080138 | A1 | 4/2007 | Hoffman et al. |
| 2007/0162172 | A1 | 7/2007 | Tanaka et al. |
| 2007/0215285 | A1 | 9/2007 | Kimball et al. |
| 2008/0066861 | A1 | 3/2008 | Kimball et al. |
| 2009/0007642 | A1 | 1/2009 | Busby et al. |
| 2009/0322342 | A1 | 12/2009 | Keil et al. |
| 2010/0006417 | A1 | 1/2010 | Booth et al. |
| 2010/0007337 | A1 | 1/2010 | Booth et al. |
| 2010/0007359 | A1 | 1/2010 | Booth et al. |
| 2010/0007362 | A1 | 1/2010 | Booth et al. |
| 2010/0033195 | A1 | 2/2010 | Booth et al. |

FOREIGN PATENT DOCUMENTS

| | | |
|---|---|---|
| JP | 2008-016517 A | 1/2008 |
| KR | 10-0378187 B1 | 3/2003 |
| KR | 10-2004-0024720 A | 3/2004 |
| KR | 10-2007-0035346 A | 3/2007 |
| KR | 10-2008-0048310 A | 6/2008 |

OTHER PUBLICATIONS

"International Preliminary Report on Patentability", Issued in PCT Application No. PCT/US2009/040756; Mailing Date: Jan. 20, 2011.
"International Preliminary Report on Patentability", Issued in PCT Application No. PCT/US2009/049757; Mailing Date: Jan. 20, 2011.
"International Preliminary Report on Patentability", Issued in PCT Application No. PCT/US2009/049759; Mailing Date: Jan. 20, 2011.
"International Preliminary Report on Patentability", Issued in PCT Application No. PCT/US2009/049760; Mailing Date: Jan. 20, 2011.
"International Preliminary Report on Patentability", Issued in PCT Application No. PCT/US2009/0419761; Mailing Date: Jan. 20, 2011.
"International Search Report", Issued in PCT Application No. PCT/US2009/049759; Mailing Date: Feb. 3, 2010.
"Written Opinion", Issued in PCT Application No. PCT/US2009/049759; Mailing Date: Feb. 3, 2010.
"International Search Report", Issued in PCT Application No. PCT/US2009/048747; Mailing Date: Feb. 11, 2010.
"Written Opinion", Issued in PCT Application No. PCT/US2009/048747; Mailing Date: Feb. 11, 2010.
"international Search Report", Issued in PCT Application No. PCT/US2009/049757; Mailing Date: Feb. 23, 2010.
"Written Opinion", Issued in PCT Application No. PCT/US2009/049757; Mailing Date: Feb. 23, 2010.
"International Search Report", Issued in PCT Application No. PCT/US2009/049760; Mailing Date: Feb. 23, 2010.
"Written Opinion", Issued in PCT Application No. PCT/US2009/049760; Mailing Date: Feb. 23, 2010.
"International Search Report", Issued in PCT Application No. PCT/US2009/049762; Mailing Date: Feb. 24, 2010.
"Written Opinion", Issued in PCT Application No. PCT/US2009/049762; Mailing Date: Feb. 24, 2010.
"international Search Report", Issued in PCT Application No. PCT/US2009/049756; Mailing Date: Mar. 2, 2010.
"Written Opinion", Issued in PCT Application No. PCT/US2009/049756; Mailing Date: Mar. 2, 2010.
"International Search Report", Issues in PCT Application No. PCT/US2009/049761; Mailing Date: Feb. 24, 2010.
"Written Opinion", Issued in PCT Application No. PCT/US2009/049761; Mailing Date: Feb. 24 2010.
"Non Final Office Action", U.S. Appl. No. 12/477,007, Mailing Date: Aug. 23, 2011.
"International Preliminary Report on Patentabty", PCT Application No. PCT/US2009/049762, Mailing Date: Jan. 20, 2011.
"Notice of Allowance", U.S. Appl. No. 12/498,934, Mailing Date: Nov. 28, 2011.
"Non Final Office Action", U.S. Appl. No. 12/498,940, Mailing Date: Dec. 7, 2011.
"Non Final Office Action", U.S. Appl. No. 12/498,940, Mailing Date: Oct. 16, 2012.
"Finai Office Action", U.S. Appl. No. 12/477,007, Mailing Date: Apr. 26, 2012.
"Finai Office Action", U.S. Appl. No. 12/498,940, Mailing Date: Apr. 23, 2012.

* cited by examiner

CAPACITIVELY-COUPLED ELECTROSTATIC (CCE) PROBE ARRANGEMENT FOR DETECTING DECHUCKING IN A PLASMA PROCESSING CHAMBER AND METHODS THEREOF

PRIORITY CLAIM

This application is related to and claims priority under 35 U.S.C. §119(e) to a commonly assigned provisional patent application entitled "Capacitively-Coupled Electrostatic (CCE) Probe Arrangement For Detecting Dechucking In A Plasma Processing Chamber," by Booth et al., Application Ser. No. 61/078,742, filed on Jul. 7, 2008, which is incorporated by reference herein.

BACKGROUND OF THE INVENTION

Dining the processing of a substrate in the plasma processing chamber, the substrate is typically clamped to a temperature-controlled chuck. Clamping is often performed using electrostatic clamping, which involves creating an electrostatic charge on the substrate to cause the substrate to be attracted to the electrostatic chuck. Clamping is an important component of substrate temperature control since proper clamping permits helium cooling of the back side of the substrate, to be properly controlled.

Following the processing step, the substrate needs to be dechucked. Dechucking involves removing the electrostatic charge from the substrate to remove the attraction force between the substrate and the electrostatic chuck. In most cases, the removal of the electrostatic charge from the substrate is accomplished by executing a dechucking plasma step whereby a plasma specifically formulated for the purpose of removing electrostatic charge from the substrate is employed. This plasma supplies the current to neutralize the electrostatic charge on the substrate. Following the electrostatic charge removal, lift pins disposed in the electrostatic chuck body may be employed to lift the substrate upward to separate the substrate from the electrostatic chuck surface, thereby allowing a robot arm to remove the substrate from the plasma processing chamber.

Proper dechucking is essential to the attainment of a high process yield and system throughput. If the electrostatic charges are not satisfactorily removed from the substrate, there is a possibility of wafer breakage when the lift pins attempt to lift up the substrate while the substrate is still clamped to the electrostatic chuck. When this happens, the substrate may be broken and/or otherwise destroyed, and a substantial amount of time and effort is then required to clean the substrate debris from the chamber. When the chamber is opened for cleaning, the entire plasma processing system is taken off the production line. Accordingly, substrate breakage due to improper dechucking is a costly occurrence for IC manufacturers and greatly increases the cost of tool ownership if allowed to occur.

Due to the severity of the consequences associated with improper dechucking, the dechucking plasma step in the prior art is often executed for a specified period of time duration, which may be determined using a best known method, or BKM, specification. The duration of the plasma dechucking step is usually fairly conservative (i.e., long in time duration) to ensure that the electrostatic charge is completely removed from the substrate. In the typical case, the dechucking plasma is run for the entire duration irrespective whether the electrostatic clamping charge has already been removed after only a few seconds. Following the expiration of the dechucking period, it is assumed that the substrate is ready to be lifted even if the electrostatic charge has not been satisfactorily removed. For this reason, the dechucking plasma duration tends to be very conservative in the prior art.

If satisfactory electrostatic charge removal occurs very early on in the plasma dechucking duration, the remaining portion of the plasma dechucking duration represents, in essence, wasted time since enough electrostatic charge has already been removed and no useful process occurs on the wafer and inside the plasma processing chamber during the remaining portion of the plasma dechucking process. The wasted time reduces the overall throughput of the plasma processing system, leading to a higher cost of ownership for the plasma tool (as a function of units of device produced). Furthermore, the presence of the dechucking plasma in the chamber during the wasted time duration contributes to the premature degradation of the chamber components (thereby necessitating more frequent cleaning and maintenance cycles) and/or contributes to the unwanted etching of the substrate without a corresponding benefit in terms of improved and/or increased substrate production.

On the other hand, if the electrostatic charge is not satisfactorily removed from the substrate after the expiration of the dechucking plasma duration, the initiation of the substrate removal step often results in broken substrates.

In view of the foregoing, there are desired improved techniques for detecting whether the dechucking is successful and for minimizing the time duration required to perform the dechucking step.

BRIEF SUMMARY OF THE INVENTION

The invention relates, in an embodiment, to a method for identifying a signal perturbation characteristic of a dechucking event within a processing chamber of a plasma processing system is provided. The method includes executing a dechucking step within the processing chamber to remove a substrate from a lower electrode, wherein the dechucking step includes generating a plasma capable of providing a current to neutralize an electrostatic charge on the substrate. The method also includes employing a probe head to collect a set of characteristic parameter measurements during the dechucking step. The probe head is on a surface of the processing chamber, wherein the surface is within close proximity to a substrate surface. The method further includes comparing the set of characteristic parameter measurements against a pre-defined range. If the set of characteristic parameter measurements is within the pre-defined range, the electrostatic charge is removed from the substrate and the signal perturbation characteristic of the dechucking event is detected.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to the use of capacitively-coupled electrostatic (CCE) probes to detect the successful completion of the dechucking step. CCE probes have long been employed to measure plasma processing parameters. CCE probes are known in the art and details may be obtained from publicly available literature, including for example U.S. Pat. No. 5,936,413 entitled "Method And Device For Measuring An Ion Flow In A Plasma" (Aug. 10, 1999), which is incorporated herein by reference. CCE probes offer many advantages, including for example improved detection sensitivity, minimal perturbation to the plasma due to the small size of the sensor, ease of mounting on the chamber wall, insensitivity to polymer deposition on the sensor head. Furthermore, the plasma-facing surface of the sensor can often be made of the same material as that of the surrounding chamber wall, thereby further minimizing perturbation to the plasma. These advantages make CCE probes highly desirable for use in sensing process parameters.

Figure 1:
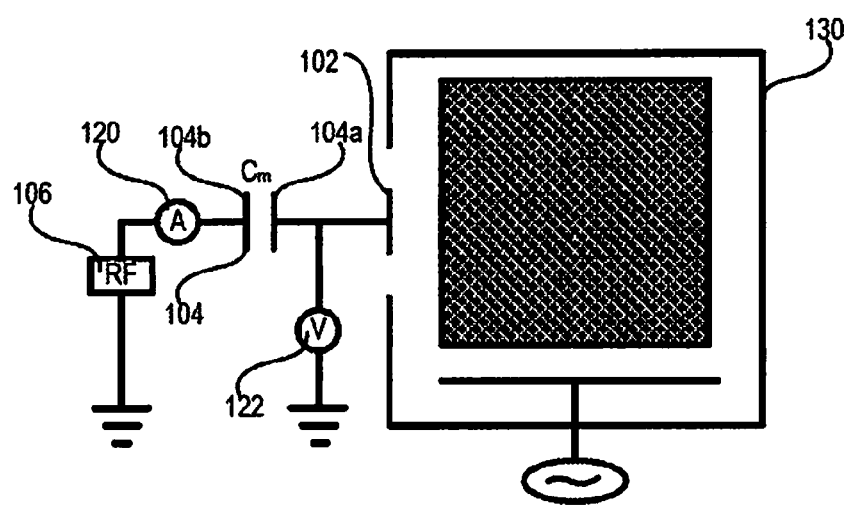
FIG. 1 shows an example CCE probe arrangement.

Generally speaking, a CCE probe arrangement involves a plasma-facing sensor connected to one terminal of a measuring capacitor. An example CCE probe arrangement is shown in FIG. 1 herein. In FIG. 1, plasma facing sensor 102 (which is disposed in a wall of chamber 130) is coupled to one plate 104a of measuring capacitor 104. The other plate 104b of the measuring capacitor 104 is coupled to an RF voltage source 106. The RF voltage source 106 periodically supplies RF oscillation trains and measurements are performed across the measuring capacitor to determine the rate of capacitor current discharge in between RF oscillation trains. A current measurement device 120 is disposed in series between measuring capacitor 104 and RF voltage source 106 to detect the capacitor current discharge rate. Alternatively or additionally, a voltage measurement device 122 is coupled between plate 104a and ground to measure the potential of the probe head. Details pertaining to the CCE probe arrangement and CCE probe operation are discussed in the aforementioned U.S. Pat. No. 5,936,413 and will not be further discussed herein.

As mentioned, a probe head made of a conductive material is installed in a surface of the chamber. A short RF train is applied to the probe, causing the capacitor (Cm) to charge up and the surface of the probe to acquire a negative potential (several tens of volts negative with respect to ground). Following the end of the RF pulse, the potential of the probe decays back to the floating potential as Cm discharges. The rate at which the potential changes is determined by the plasma characteristics. During this discharge, the potential of the probe Vf is measured with voltage measuring device 122, and the current following to the probe and through capacitor Cm is measured with the current measuring device 120. The curves V(t) and I(t) are used to construct a current-voltage characteristic, VI, which is then analyzed by a signal processor. A model function is fitted to these data points, producing estimates of the floating potential Vf, ion saturation current Isat and election temperature Te. Further details may be found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477,007), which is included in the DISCUSSION herein.

It is theorized by the inventors herein that the removal of the electrostatic charge from the substrate allows the substrate to "pop" free of the ESC chuck's upper surface. Since RF power is coupled to the plasma via the ESC chuck and the substrate, the separation of the substrate from the ESC chuck changes the capacitive coupling of the RF to the plasma. This change in turn leads to a change in the plasma ion flux (and/or in the electron temperature and/or in the floating potential), which may be detectable by the CCE probe.

In accordance with one or more embodiments of the present invention, innovative techniques are proposed to facilitate the detection of the successful completion of the dechucking step. It is realized by the inventors herein that by monitoring the ion flux, a signal perturbation characteristic of dechucking may be detected using appropriate signal processing software and/or hardware. Alternatively or additionally, the electron temperature may be monitored. By monitoring the electron temperature, a signal perturbation characteristic of dechucking may be detected using appropriate signal processing software and/or hardware. Alternatively or additionally, the floating potential of the probe head may be monitored. By monitoring the floating potential, a signal perturbation characteristic of plasma ignition may be detected using appropriate signal processing software and/or hardware.

Figure 2:
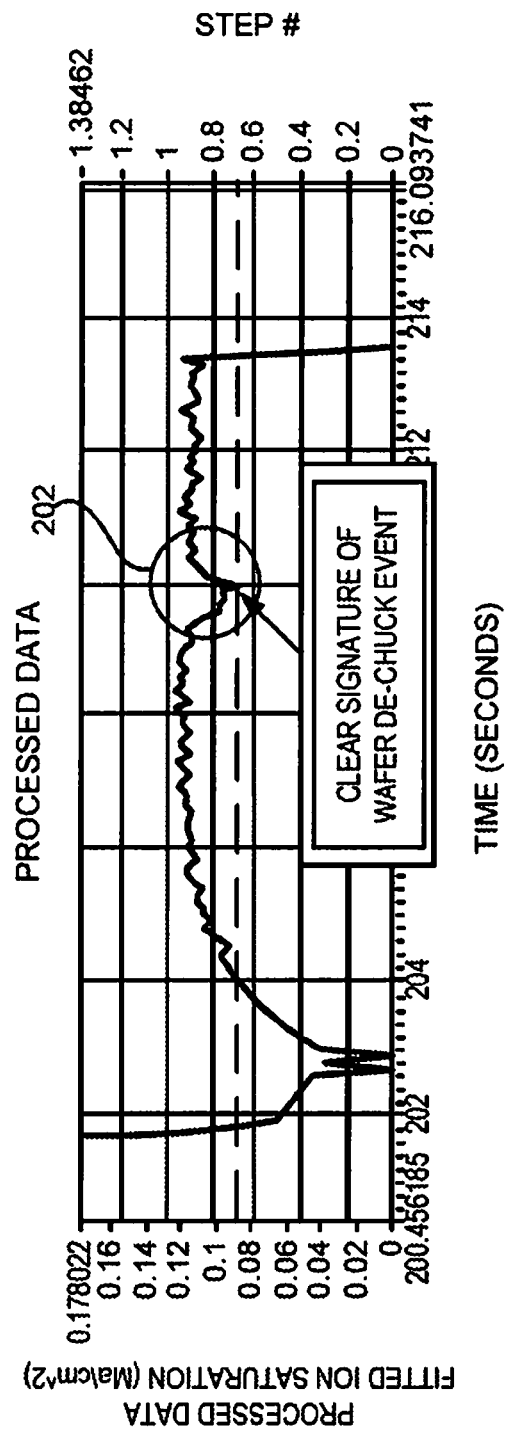
FIG. 2 shows, in accordance with an embodiment of the invention, a plot of the ion current (ion flux per unit area per unit of time) versus time.

FIG. 2 shows, in accordance with an embodiment of the invention, a plot of the ion current (ion flux per unit area per unit of time) versus time. In FIG. 2, the ion current signal shows a unique signal perturbation 202 or "signature" that is indicative of dechucking. By focusing detection in the time period when dechucking is expected (per process recipe) and by using a highly sensitive yet polymer-deposition resistant detection technique such as the CCE probe-based technique discussed herein, most if not all dechucking events can be readily detected.

Figure 3:
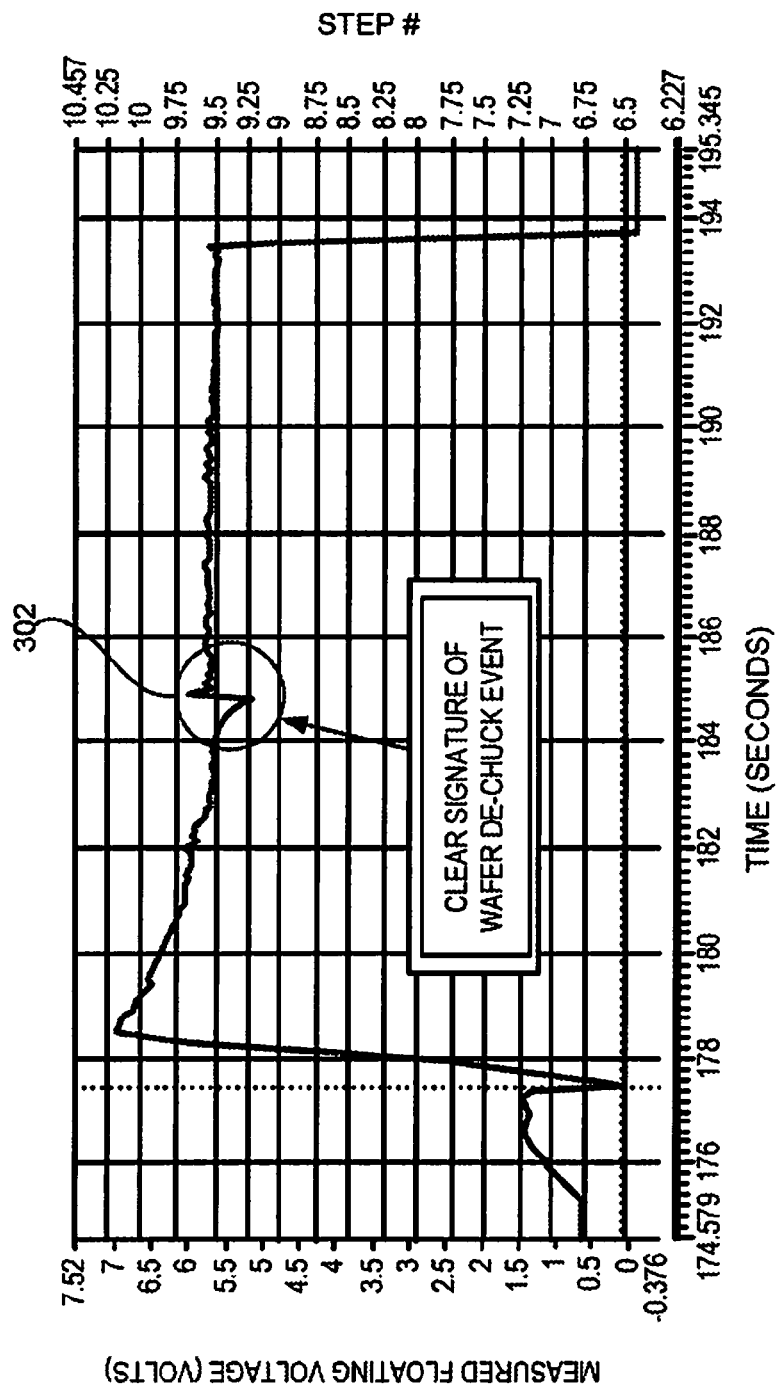
FIG. 3 shows, in accordance with an embodiment of the invention, another plot of the floating voltage of the probe versus time.

FIG. 3 shows, in accordance with an embodiment of the invention, a plot of the floating voltage of the probe versus time. In FIG. 3, the floating voltage signal also shows a unique signal perturbation 302 or "signature" that is indicative of dechucking. By focusing detection in the time period when dechucking is expected (per process recipe) and by using a highly sensitive yet polymer-deposition resistant detection technique such as the CCE probe-based technique discussed herein, dechucking events can be readily detected.

In one or more embodiments, once the signal perturbation characteristic of dechucking is detected, the dechucking plasma process may cease immediately or may be allowed to continue for some short period of time to ensure satisfactory electrostatic charge removal. At any rate, the termination of the plasma dechucking step is now based on a detected event, namely the actual dechucking instead of based on the expiration of some arbitrary and predefined time duration.

In one or more embodiments of the invention, characteristic parameter measurements (such as ion flux measurements, electron temperature measurements and/or floating potential measurements) may be empirically obtained for the successful dechucking of a set of test or sample substrates. Once these characteristic parameters are ascertained, they may be employed to compare against parameter readings from future dechucking plasma processes to determine whether the dechucking has been successfully completed.

In one or more embodiments of the invention, the ion flux signal and/or the electron temperature signal and/or the floating voltage signal may be monitored to ascertain the effectiveness of the plasma dechucking steps. For example, if it takes an unduly long time to remove the electrostatic charge from the substrate and to produce the aforementioned dechucking signature in the monitored signal, dechucking plasma process parameters may be adjusted to improve dechucking efficiency. For example, the potentials applied to the substrate during chucking and dechucking may be adjusted based on measured CCE probe data.

In contrast to prior art dechucking detection techniques, such as measuring the backside helium cooling flow rate, the inventive CCE probe-based dechucking detection technique is highly sensitive. This is because embodiments of the invention uses a probe that directly measures the ion flux to a reactor wall, close to the substrate being processed. Thus, the ion flux measured by the probe is very closely related to the flux that arrives at the substrate surface, rendering tins measurement an inherently absolute measurement.

Additionally, there is minimal perturbation to the plasma since the CCE probe head tends to be small, to be installed flushed with the surrounding plasma-facing structures of the plasma processing chamber, and may have a plasma-facing probe surface formed of the same material as that of the plasma-facing components of the chamber. Furthermore, the inventive CCE probe-based dechucking detection technique is insensitive to polymer deposition on the plasma-facing probe head since the current is capacitively coupled through any deposition that may be formed on the plasma-facing surface of the probe head.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

The DISCUSSION is also found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477,007) and are incorporated by reference herein.

Discussion of Methods for Automatically Characterizing a Plasma

Advances in plasma processing have provided for growth in the semiconductor industry. To supply chips for a typical electronic product, hundreds or thousands of substrates (such as semiconductor wafers) may be processed. In order for the manufacturing company to be competitive, the manufacturing company needs to be able to process the substrates into quality semiconductor devices with minimal processing time.

Typically, during plasma processing, problems may arise that may cause the substrates to be negatively impacted. One important factor that may alter the quality of the substrate being processed is the plasma itself. In order to have sufficient data to analyze the plasma, sensors may be employed to collect processing data about each substrate. The data collected may be analyzed in order to determine the cause of the problems.

Figure 4:
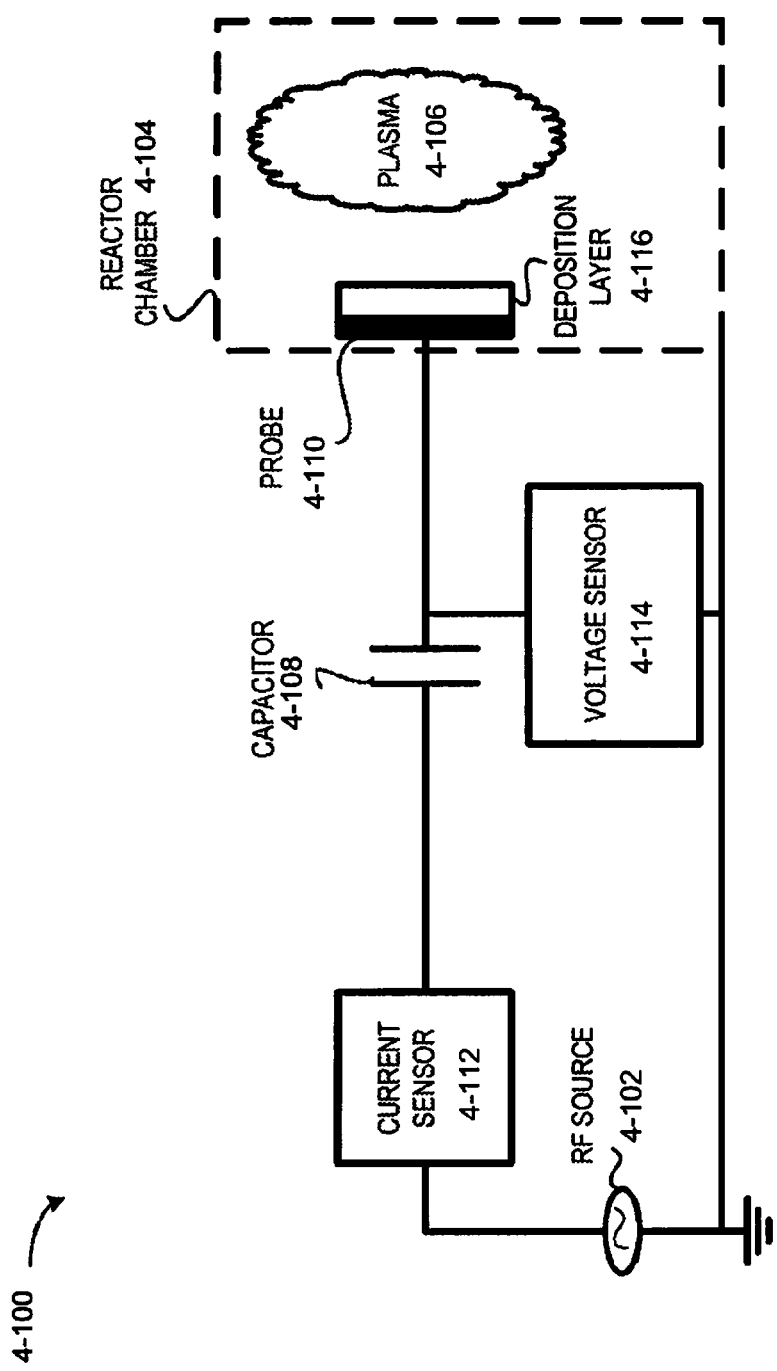
FIG. 4 of the DISCUSSION shows a simple schematic diagram of a portion of a plasma system with a radio frequency (RF) source capacitively-coupled to a reactor chamber to produce plasma.

To facilitate discussion. FIG. 4 shows a simple schematic diagram of a data collecting probe in a portion of a plasma system 4-100. Plasma system 4-100 may include a radio frequency (RF) source 4-102, such as a pulsating RF frequency generator, capacitively-coupled to a reactor chamber A-104 to produce plasma 4-106. When RF source 4-102 is turn on, a bias voltage is developed across an external capacitor 4-108, which may be about 26.2 nanofarads (nF). In an example, RF source 4-102 may provide a small burst of power (e.g., 11.5 megahertz) every few milliseconds (e.g., about five milliseconds) causing external capacitor 4-108 to be charged. When RF source 4-102 is turned off, a bias voltage remains on external capacitor A-108 with a polarity such that probe 4-110 is biased to collect ions. As the bias voltage decays, the curves as shown in FIGS. 5A, 5B and 6 may be traced.

Those skilled in the art are aware that probe 4-110 is usually an electrical probe with a conducting planar surface that may be positioned against the wall of reactor chamber 4-104. Probe 4-110 is thus directly exposed to reactor chamber 4-104 environment. Current and voltage data collected by probe 4-110 may be analyzed. Since certain recipe may cause a non-conducting deposition layer 4-116 to be deposited on probe 4-110, not all probes may be able to collect reliable measurements. However, those skilled in the art are aware that a PIF (planar ion flux) probe enables data to be collected despite the non-conducting deposition layer since the PIF probe scheme is not required to draw a direct current (DC) to implement a measurement.

The current and voltage signal in plasma system 4-100 is measured by other sensors. In example, when RF source 4-102 is switched off, current sensor 4-112 and a high impedance voltage sensor 4-11, are employed to measure the current and the voltage, respectively. The measurement data collected from current sensor 4-112 and voltage sensor 4-114 may then be plotted to create a current graph and a voltage graph. The data may be manually plotted or the data may be entered into a software program to create the graphs.

Figure 5A:
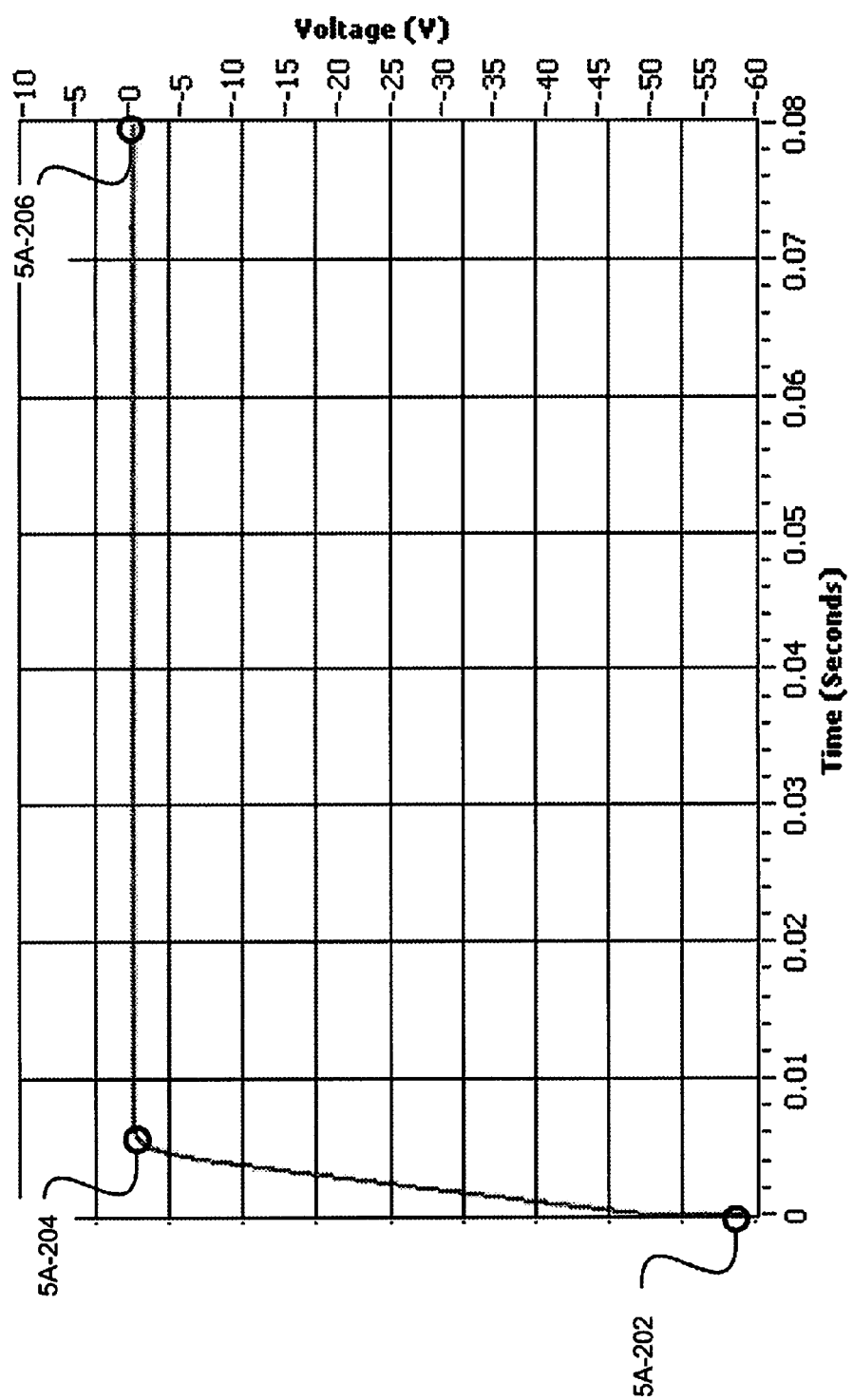
FIG. 5A of the DISCUSSION shows a graph of voltage versus time after a RF charge.
Figure 5B:
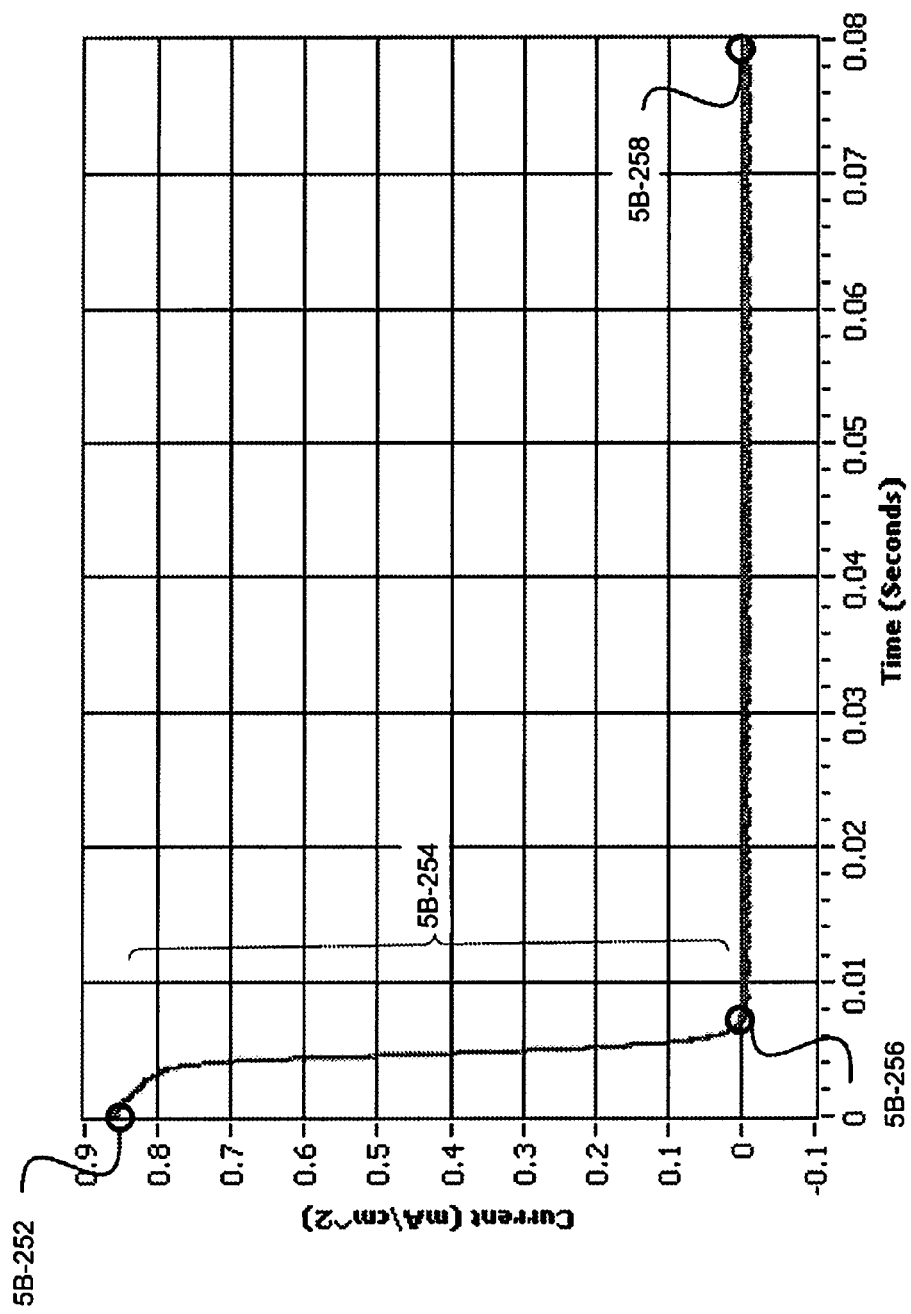
FIG. 5B of the DISCUSSION shows a graph of current data collected after a RF charge.
Figure 6:
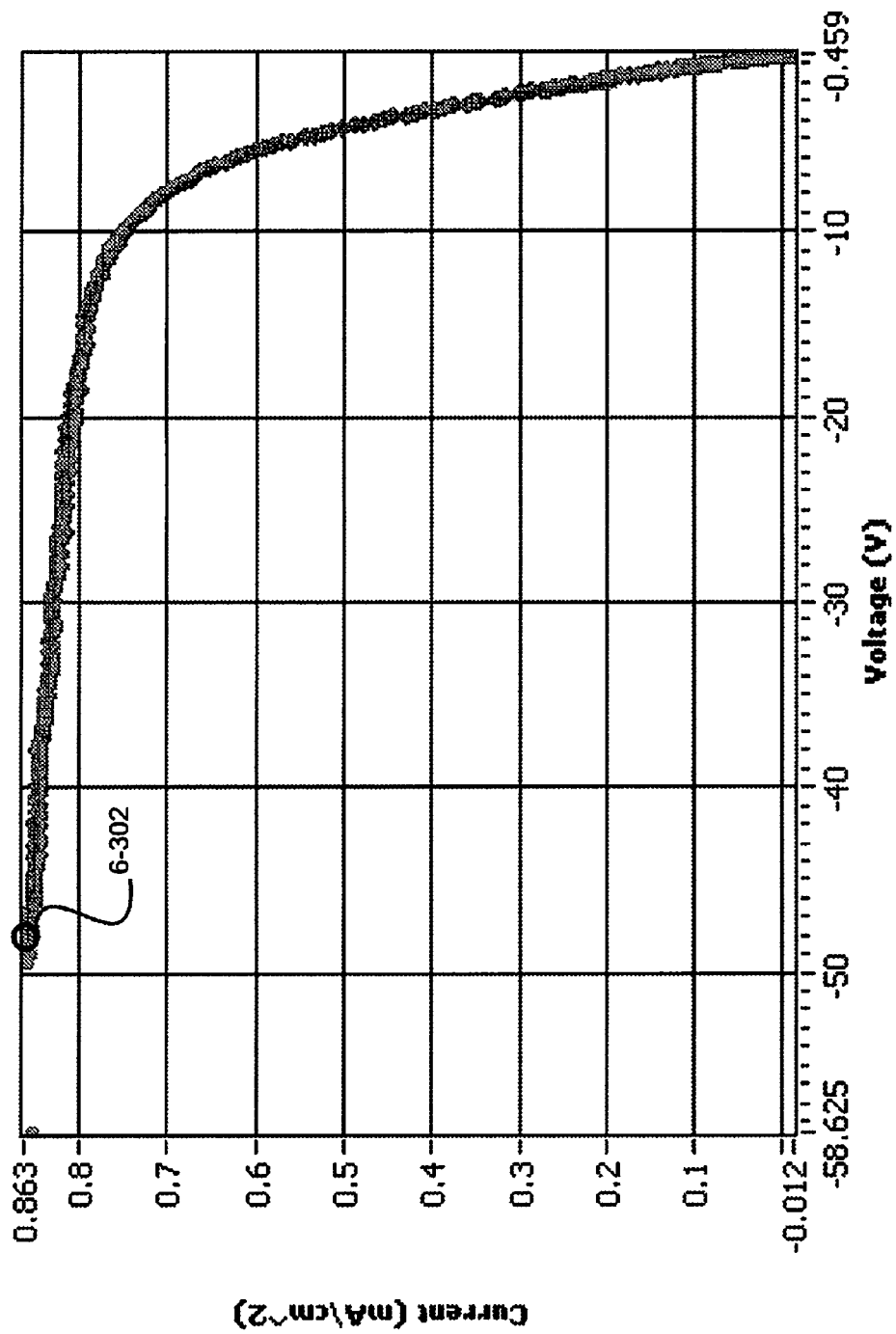
FIG. 6 of the DISCUSSION shows a simple current versus voltage graph for a single time interval between a RF burst.

FIG. 5A shows a graph of voltage versus time after a RF charge cycle. At data point 5A-202, RF source 4-102 has been switched off after an RF charge has been provided (i.e., RF burst). In this example, at data point 5A-202, the voltage across probe 4-110 is about negative 57 volts. As plasma system 4-100 returns to a rest state (interval between data points 5A-204 and 5A-206), the voltage usually reaches a floating voltage potential. In this example, the floating voltage potential rises from about negative 57 volts to about zero volt. However, the floating voltage potential does not have to be zero and may be a negative or a positive bias voltage potential.

Similarly, FIG. 5B shows a graph of current data collected after a RF charge. At data point 5B-252, RF source 4-102 has been switched off after an RF charge has been provided. During a decay period 5B-254, the return current at external capacitor 4-108 may be discharged. In an example, at full charge (data point 5B-252), the current is about 0.86 mA/cm$^2$. However, when the current is fully discharged (data point 5B-256), the current has returned to zero. Based on the graph, the discharge takes about 75 milliseconds. From data point 5B-256 to data point 5B-258, the capacitor remains discharged.

Since both the current data and the voltage data are collected over a period of time, a current versus voltage graph may be generated by coordinating the time in order to eliminate the time variable. In other words, the current data collected may be matched against the voltage data collected. FIG. 6 shows a simple current versus voltage graph for a single time interval between a RF burst. At data point 6-302, RF source 4-102 has been switched off after an RF charge has been provided.

By applying a non-linear fit to the data collected during each RF burst, plasma 4-106 may be characterized. In other words, parameters (e.g., ion saturation, ion saturation slope, electron temperature, floating voltage potential, and the like) that may characterize plasma 4-106 may be determined. Although plasma 4-106 may be characterized with the data collected, the process of calculating the parameters is a tedious manual process that requires human intervention. In an example, when the data has been collected after each RF burst (i.e., when the RF charge has been provided and then turned off), the data may be fed into a software analysis program. The software analysis program may perform a non-linear fit to determine the parameters that may characterize the plasma. By characterizing the plasma, the engineer may be able to determine how a recipe may be adjusted in order to minimize substandard processing of the substrates.

Unfortunately, the prior art method of analyzing the data for each RF burst may require several seconds or as much as several minutes to complete. Since there are typically thousands, if not millions of RF bursts to analyze, the total time for characterizing the plasma for a recipe may take hours to calculate. As a result, the prior art method is not an effective method in providing timely relevant data for process control purposes.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, the PIF probe method may be employed to collect data about the plasma that may be positioned within the reactor chamber environment. Data collected from a sensor (e.g., PIF probe) may be employed to characterize the plasma in the reactor chamber. Additionally, since the sensor employs a collection surface as shown in FIG. 4, data about the chamber surface may also be determined. In the prior art, the data collected by the PSD probe provides a ready source of data that is available for analysis. Unfortunately, the sheer volume of data that may be collected has made analyzing the data in a timely manner a challenge. Since thousands or even millions of data points may be collected, the task of identifying the relevant interval in order to accurately characterize a plasma may be a daunting task, especially since the data is usually being analyzed manually. As a result, the data collected has not been useful in providing the plasma processing system with a timely characterization of the plasma.

However, if relevant data points that are needed in order to characterize a plasma are identified from the thousands/millions of data points that may be collected, then the time required to characterize a plasma may be significantly reduced. In accordance with embodiments of the invention, a method is provided for automatically characterizing plasma in a relatively short time period. Embodiments of the invention described herein provide for an algorithm for identifying the relevancy range in order to reduce the data points that may need to be analyzed in order to characterize a plasma. As discussed herein, the relevancy range refers to a smaller set of data points from the thousands or millions of data points that may be gathered between each RF burst. Embodiments of the invention further provide for estimating seed values that may be applied to a mathematical model that calculates the values for characterizing a plasma. By performing curve-fitting to the relevancy range, parameters that may be employed to characterize a plasma may be calculated.

The features and advantages of the present invention may be better understood with reference to the figures and discussions that follow.

Figure 7:
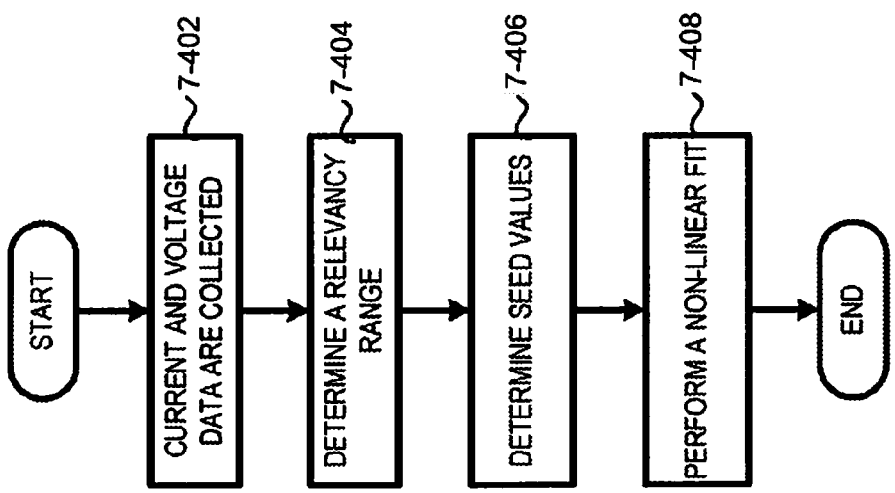
FIG. 7 of the DISCUSSION shows, in an embodiment of the invention, a simple flow chart illustrating the overall steps for automatically characterizing plasma during substrate processing.

FIG. 7 shows, in an embodiment of the invention, a simple flow chart illustrating the steps for automatically characterizing plasma during substrate processing. Consider the situation wherein, an RF charge has been provided during substrate processing.

At a first step 7-402, current and voltage data are collected. In an example, after the RF source has been turned on, an RF charge (pulse) is provided. After the RF charge has been turn off, a current sensor and a voltage sensor may be employed to collect data at a probe, such as a planar ion flux probe, which may be mounted to a chamber wall of the reactor chamber. As aforementioned, the number of data points that may be collected by the sensors may range in the thousands or millions. In some cases, thousands to ten of thousands of data points may be collected between each RF burst making near-real-time analysis in the prior art nearly impossible.

In the prior art, several hours may be allotted for analyzing the measurement data that is collected during semiconductor substrate processing. In one aspect of the invention, the inventors herein realized that the measurement data between each RF burst does not have to be analyzed in order to characterize a plasma. Instead, if curve-fitting is applied to a relevancy range of the data set, parameters that may be employed to characterize the plasma may be determined.

At a next step 7-404, a relevancy range is determined. As aforementioned, the relevancy range refers to a subset of the data set that has been collected between each RF burst. In the prior art, since the data is being manually analyzed, the sheer volume of the data collected make calculating the relevancy range a challenging task. In many instances, the relevancy range may be visually estimated. In identifying the relevancy range, noises that may exist may be substantially eliminated from the subset of data set. In an example, during complex substrate processing, a polymer buildup may occur on the probe, causing a portion of the data collected to be skewed. For example, the portion of the data that may be impacted tends to be the data that may be collected once the capacitor has been fully discharged. In identifying the relevancy range, data associated with the polymer buildup may be removed from the analysis. In other words, the determination of the relevancy range may enable plasma characterization to occur without being subject to random noises. Discussion about how a relevancy range may be determined, for an example, is provided later in the discussion of FIG. 8.

In addition to identifying the relevancy range, the seed values may also be determined, at a next step 7-406. As discussed herein, the seed values refer to the estimated value of the slope, the election temperature, the ion saturation value, the floating voltage potential, and the like. Discussion about how the seed values may be estimated, for example, is provided in the discussion of FIG. 8.

The relevance range and the seed values are utilized to perform curve-fitting. Since curve-fitting has to be performed before the next RF burst, the methods employed to determine the relevancy range and/or seed values have to utilize minimum overhead and produce values that are close to the final fit values, thereby reducing number of curve-fitting iterations that may be required in order to achieve a rapid convergence.

With the relevancy range and the seed values, at a next step 7-408, a non-linear fit (e.g., curve-fitting) may be performed, thereby enabling the plasma to be characterized within a shorter time period without requiring an expensive high-end computer. Unlike the prior art, the method allows for results from a decay interval due to a single RF burst to be characterized in approximately 20 milliseconds instead of requiring a few minutes or even a few hours to process. With near-realtime analysis capability, the method may be applied as part of an automatic control system to provide the engineer with relevant data during plasma processing.

Figure 8:
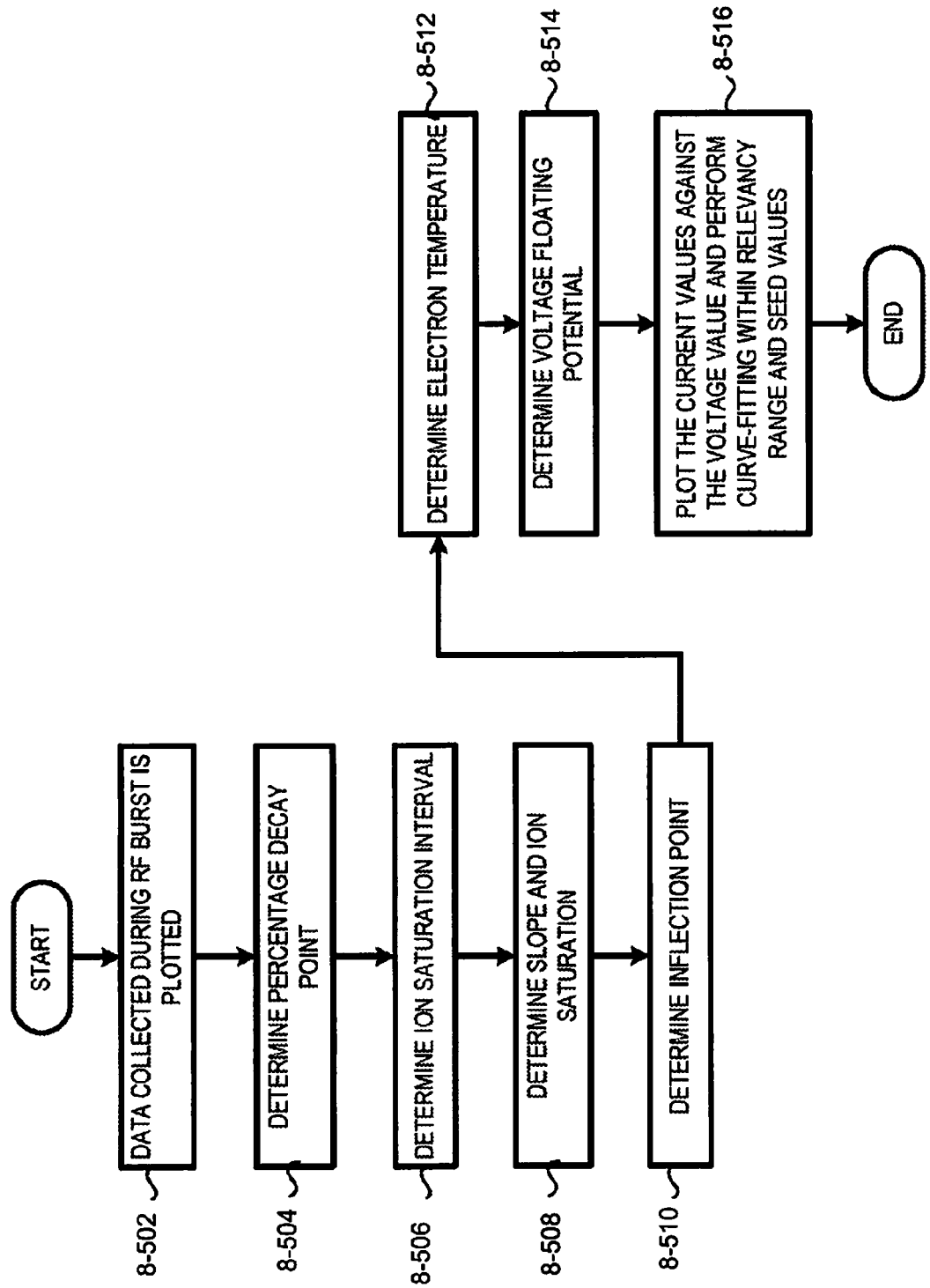
FIG. 8 of the DISCUSSION shows, in an embodiment of the invention, a simple algorithm for determining the relevancy range and the seed values.

FIG. 8 shows, in an embodiment of the invention, a simple algorithm for determining the relevancy range and the seed values. FIG. 8 will be discussed in relation to FIGS. 9A, 9B, 9C, and 9D.

Figure 9A:
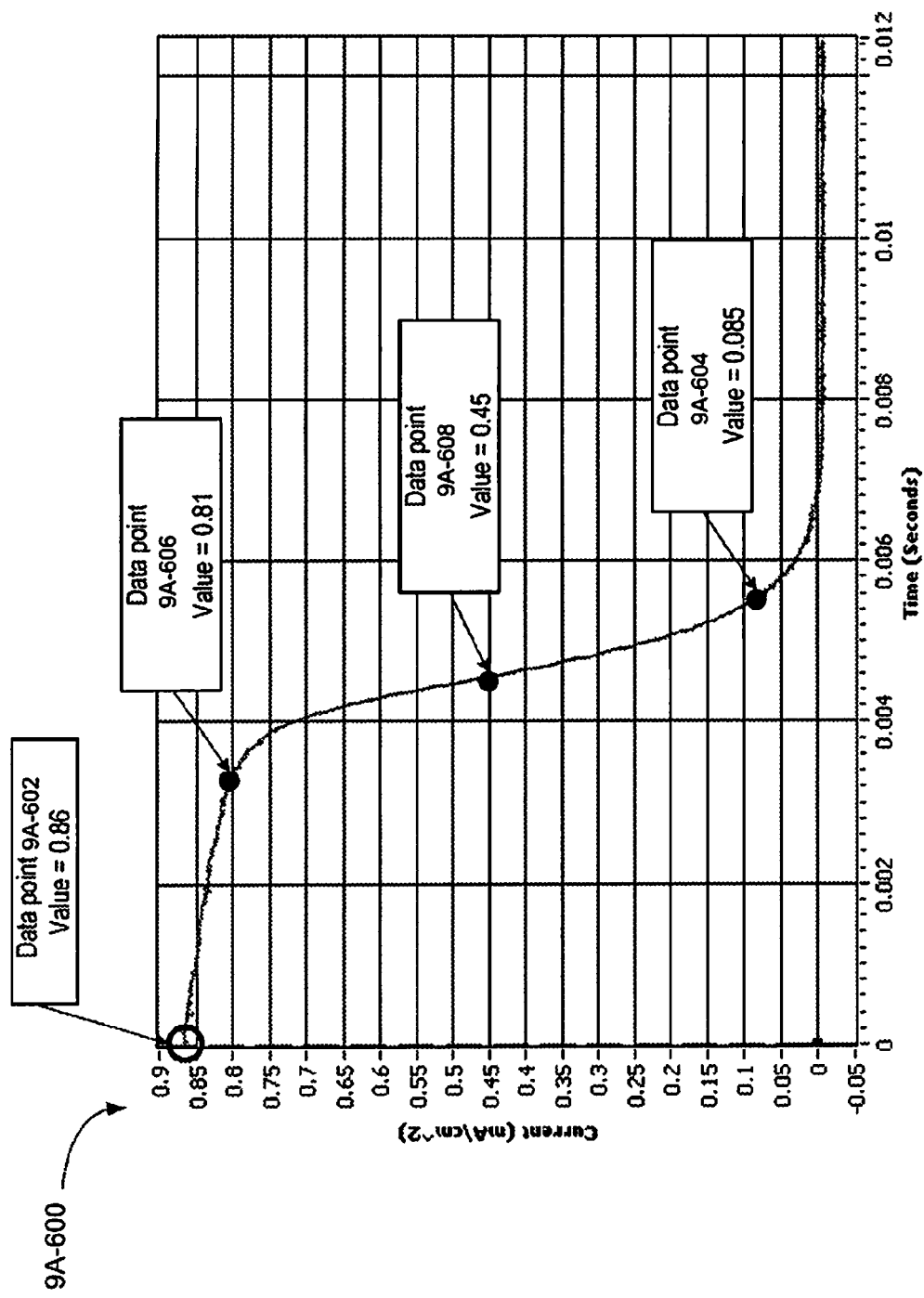
FIG. 9A of the DISCUSSION shows an example of current versus time after a RF burst.
Figure 9B:
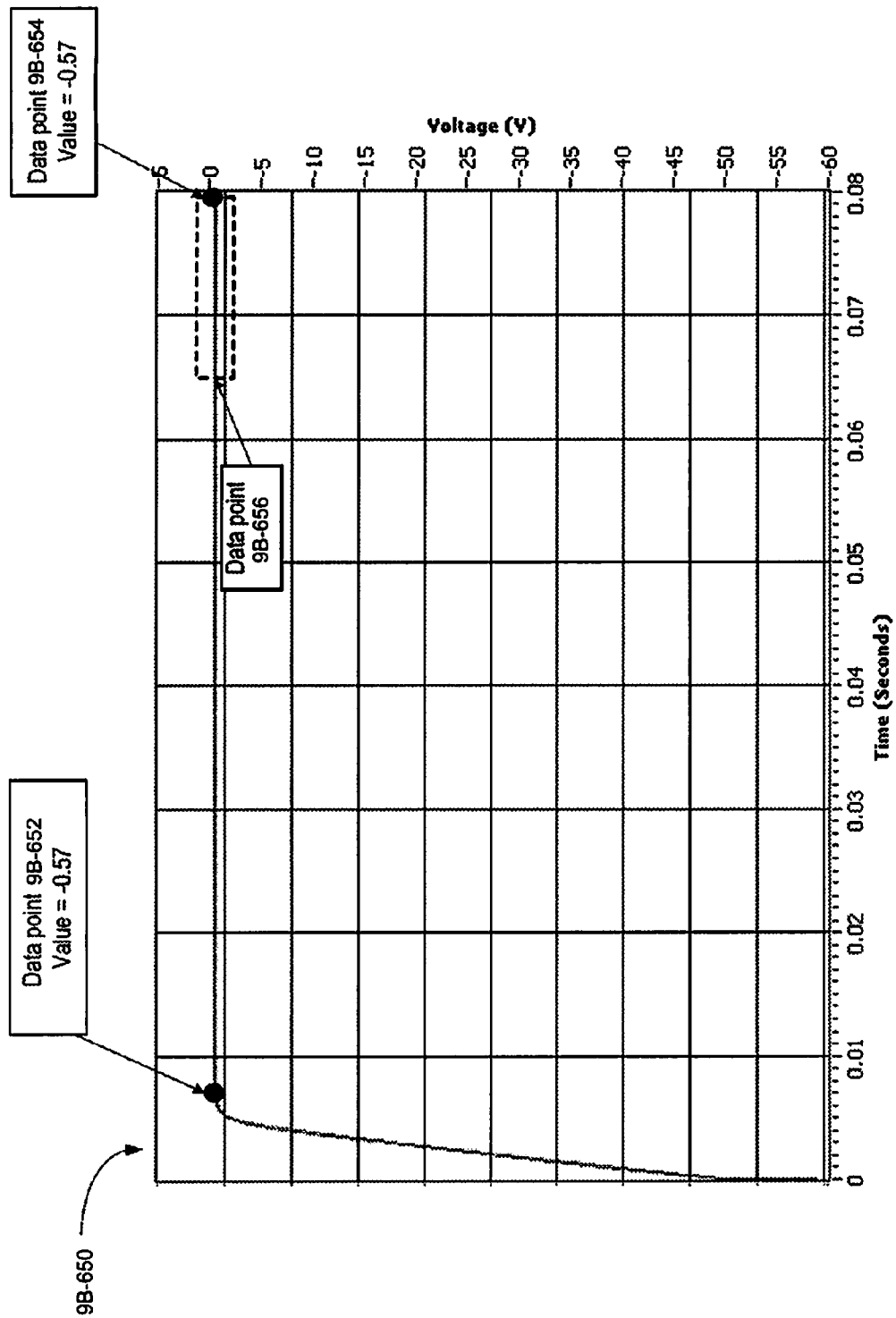
FIG. 9B of the DISCUSSION shows an example of voltage versus time after a RF burst.

At a first step 8-502, the data collected during each RF burst is automatically plotted. In an example, the current data that may be collected by the current sensor is plotted into a current versus time graph 9A-600, such as the one shown in FIG. 9A. In another example, the voltage data collected may be plotted into a voltage versus time graph 9B-650, as shown in FIG. 9B. Although the data may produce similar graphs as the prior art, unlike the prior art, the data collected is automatically fed into the analysis program without requiring human intervention. Alternatively, the measurement data collected does not have to be plotted. Instead, the data may be fed directly into the analysis program. Instead, the graphs are provided as visual examples to explain the algorithm.

Unlike the prior art, the entire data set is not analyzed in order to characterize a plasma. Instead, a relevancy range is determined. To determine the relevancy range, a percentage decay point may first be determined, at a next step 8-504. As discussed herein, the percentage decay point refers to the data point at which the original value has decayed to a certain percentage of the original value. In an embodiment, the percentage decay point may represent the end of the data interval to be analyzed. In an example, when the RF source is switched off, the current value is about 0.86 mA/cm$^2$. The value is represented by a data point 9A-602 on graph 9A-600 of FIG. 9A. If the percentage decay point is set to ten percent of the original value, the percent decay point is at data point 9A-604, which is about 0.086 mA/cm$^2$. In other words, the percentage decay point may be determined by applying a pre-defined percentage to the original value, which is value of the electrical charge when the RF source is switched off and the system is returning to an equilibrium state. In an embodiment, the percentage is empirically determined. In an embodiment, instead of employing a percentage decay point to determine the end of the data interval, the peak of a first derivative of the data collected for each RF burst may be calculated.

At a next step 8-506, the algorithm may determine the ion saturation interval, which is the data subset between the original value and a second decay point. As discussed herein, the ion saturation interval refers to the region of the current-voltage (IV) curve at which the probe potential is sufficiently negative with respect to the floating potential such that the electron flux to the probe is negligible. In this region the current to the probe increases slowly and linearly with increasingly negative potential. In addition, the ion saturation interval is the regime at which the bias voltage is sufficiently negative with respect to the floating potential such that the probe will collect all the available ions in the system. In other words, the collected current "saturates" as the bias voltage is raised sufficiently high. Also, as discussed herein, the "available ions" refers to the flux of ions impinging upon the sheath boundary, which may enlarge as the bias voltage is further increased.

In other words, the ion saturation interval is the interval from data points 9A-602 and 9A-606 of FIG. In an embodiment, the second decay point may be determined by taking a percentage of the original value (i.e., data point 9A-602). In an example, if the second decay point is about 95 percent of the original value, the second decay point is about 0.81 mA/cm$^2$ (i.e., data point 9A-606). Hence, the ion saturation interval is from the original value (data point 9A-602) to the second decay point (data point 9A-606). Note that the second decay point is between the original value (data point 9A-602) and the percentage decay point (data point 9A-604). Similar to the percentage decay point, the second decay point may also be based on a pre-defined threshold, in an embodiment. In an embodiment, the percentage is empirically determined.

Once the ion saturation interval has been determined, at a next step 8-508, the slope (s) and the ion saturation ($i_0$) may be estimated. As aforementioned, the slope (s) and the ion saturation ($i_0$) are two of the four seed values that may be applied to a mathematical model (Equation 2 below) to determine the parameters that characterize a plasma. In an example, the slope (s) may be determined by performing linear regression. In another embodiment, the algorithm may also determine the ion saturation ($i_0$) by taking the average of the data values between data points 9A-602 and 9A-606.

Figure 9C:
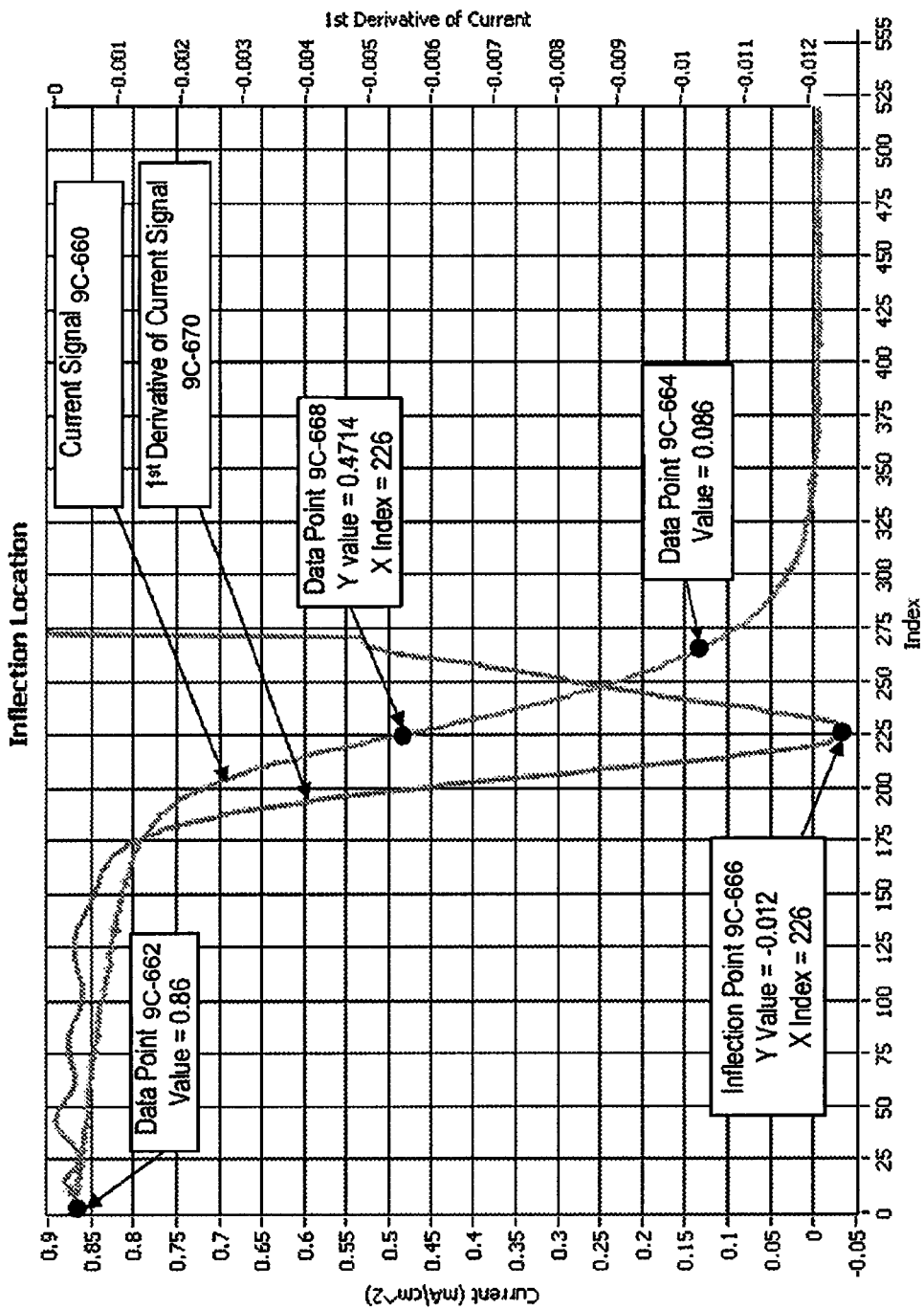
FIG. 9C of the DISCUSSION shows an example of an inflection point.

At a next step 8-510, the algorithm may determine the inflection point, which is the point at which the first derivative changes sign. In an embodiment, the inflection point may be calculated by identifying the minimal value of the first derivative of the current values between the percentage decay point and the second decay point. To illustrate, FIG. 9C shows the first derivative of the values between a percentage decay point (9C-664) and an original point (9C-662) of a current signal 9C-660. The inflection point is the minimal data point of the first derivative (9C-670), which has a value of −0.012 mA/cm² and an index value of 226 (as shown by data point 9C-666). To determine the inflection value, the index value is mapped to current signal plot 9C-660. In this example, when the index value of the first derivative is mapped to current signal 9C-660, the inflection value is 0.4714 mA/cm², as shown by data point 9C-668.

In an embodiment, the relevancy range is defined as the range between the original value and the inflection point. Additionally or alternatively, a percent decay threshold may be set (e.g., at 35 percent) instead of calculating the inflection point. In an example, using the percent decay point of 35 percent, which may be empirically determined, the relevancy range may fall between points 9A-602 and 9A-604 of FIG. 9A.

$$T_e = \text{abs}\left(\frac{I_{meas}(t)}{\left(\frac{dI_{meas}}{dV_{meas}}\right)}\right) = \text{abs}\left(\frac{I_{meas}(t)}{\left(\frac{dI_{meas}}{dt}\right)\left(\frac{dt}{dV_{meas}(t)}\right)}\right) \quad [\text{Equation 1}]$$

TABLE 1

Parameters defined

| Parameters | Variable name |
|---|---|
| $I_{meas}$ | Current measured |
| $V_{meas}$ | Voltage measured |
| t | Current time |
| $T_e$ | Electron temperature |

With the inflection point identified, the electron temperature may be estimated, at a next step 8-512. The election temperature may be estimated by employing Equation 1 above. The current and voltage data utilized to calculate the electron temperature is within the transition interval, which is usually when a probe is drawing less current than the ion saturation current. In an embodiment, the time at which the current and voltage data is measured may correspond with the inflection point. Alternatively, the inflection point of the current-voltage (I-V) curve may also be employed. Since the electron temperature is a ratio of a first derivative (as determined in calculating the percentage decay point) of the data collected for an RF burst at a time corresponding to the inflection point on the current-voltage curve, the computational overhead that may be required to generate the number is minimal.

At a next step 8-514, the algorithm may determine the floating voltage potential. Since the floating voltage potential is determined based on the voltage data collected, the floating voltage potential may be determined without first having to determine the values as calculated in steps 8-504-8-512. Those skilled in the art are aware that floating voltage potential is the electrical potential at which the probe floats after the external capacitor has fully discharged. Typically, the floating voltage potential may be determined by looking at the signal that occurs right before the next RF burst. However, due to the possibility of polymer buildup causing distortion, erroneous data (i.e., noise) may be collected; thus, the floating voltage potential may be calculated by averaging the voltage values collected toward the end of the collection period. In an embodiment, the floating voltage potential may be calculated from data point 9B-652 (the data point at which the voltage first reaches its floating potential) to data point (the data point just right before the next RF burst), as shown in FIG. 9B. In another embodiment, the floating voltage potential may be based on the voltage values within a window 9B-656, which is located between data points 9B-652 and 9B-654, as shown in FIG. 9B. In an embodiment, window 9B-656 may be of any size as long as the window begins before the prior pulse has decayed more than 99 percent and ends when the next pulse begins. In one embodiment, the floating voltage potential may be determined from a window that provides an average value with a low standard deviation (error).

As can be appreciated from the foregoing, the methods for determining the relevancy range and the seed values account for anomalies that may occur in the current, voltage and/or current-voltage (I-V) curves. In an example, polymer buildup may occur at the end of an RF burst. However, by applying the aforementioned algorithms, the relevancy range and the seed values are impervious to unexpected artifacts that may occur during processing.

Figure 9D:
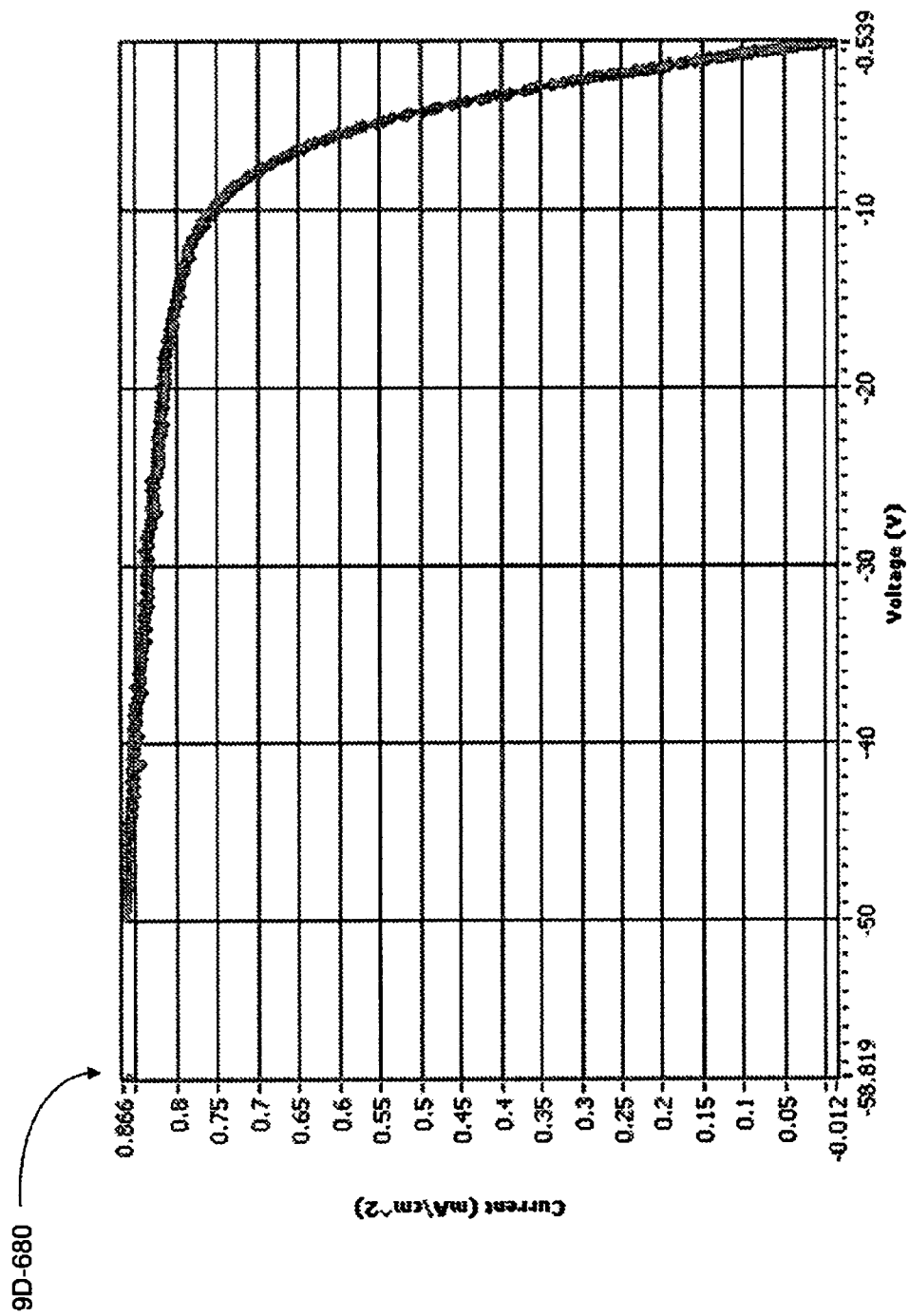
FIG. 9D of the DISCUSSION shows an example of a curve-fitting applied to a current versus voltage graph.

Once the relevancy range has been determined and the seed values have been calculated, at a next step 8-516, the current values may be plotted against the voltage values and curve-fitting may be applied to generate graph of FIG. 9D. In an example, a non-linear curve fit, such as Leveuberg-Marquardt algorithm, may be applied to perform the curve-fitting. By generating a curve-fitting graph and applying the seed values to the mathematical model, such as Equation 2 below, the four parameters that may be employed to characterize the plasma may be determined.

$$I = I_0\left\{1 - s*(V - V_f) - \exp\left[\frac{(V - V_f)}{T_e}\right]\right\} \quad [\text{Equation 2}]$$

TABLE 2

Parameters defined

| Parameters | Variable name |
|---|---|
| I | Current |
| $I_0$ | Ion saturation |
| S | Slope |
| V | Voltage |
| $V_f$ | Floating voltage potential |
| $T_e$ | Electron temperature |

As can be appreciated from one or more embodiments of the present invention, an automated method for characterizing plasma during plasma processing is provided. By determining a relevancy range and a set of seed values, plasma characterization may occur without having to process thousands or millions of data points that are usually collected after a single RF burst. The automated method transforms a previously tedious and manual process into an automatic task that may be performed quickly and efficiently. With data analysis significantly shortened from a few minutes (or even a few hours) to a few milliseconds, plasma characterization may be performed during plasma processing instead of being a post-production process. Thus, relevant data may provide insights into the current plasma environment, thereby enabling recipe and/or tool adjustment to occur and waste to be minimized.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

What is claimed is:

1. A method for identifying a signal perturbation characteristic of a dechucking event within a processing chamber of a plasma processing system, comprising:
    executing a dechucking step within said processing chamber to remove a substrate from a lower electrode, wherein said dechucking step includes generating a plasma capable of providing a current to neutralize an electrostatic charge on said substrate;
    employing a probe head to collect a set of characteristic parameter measurements of data related to characterizing said plasma capable of providing current during said dechucking step, said probe head being on a surface of said processing chamber, wherein said surface is within close proximity to a substrate surface; and
    comparing said set of characteristic parameter measurements against a pre-defined range of data related to characterizing said plasma capable of providing current, if said set of characteristic parameter measurements is within said pre-defined range, said electrostatic charge is removed from said substrate and said signal perturbation characteristic of said dechucking event is detected.

2. The method of claim 1 wherein said probe head is a capacitively-coupled electrostatic (CCE) probe.

3. The method of claim 2 wherein said probe head is a small device, wherein a plasma-facing surface of said probe head is made from a material similar to other plasma-facing components of said processing chamber.

4. The method of claim 1 wherein said set of characteristic parameter measurements is a set of ion flux measurements.

5. The method of claim 1 wherein said set of characteristic parameter measurements is a set of electron temperature measurements.

6. The method of claim 1 wherein said set of characteristic parameter measurements is a set of floating potential measurements.

7. The method of claim 1 wherein if said set of characteristic parameter measurements is not within said pre-defined range, said electrostatic charge is not neutralized and said dechucking event is not terminated.

8. An arrangement for identifying a signal perturbation characteristic of a dechucking event within a processing chamber of a plasma processing system, comprising:
    a substrate, wherein said substrate is positioned on a lower electrode within said processing chamber;
    means for creating a plasma capable of providing a current to neutralize an electrostatic charge on said substrate;
    a probe arrangement, wherein said probe arrangement includes a plasma-facing sensor and is disposed on a surface of said processing chamber, said surface is within close proximity to a surface of said substrate, wherein said probe arrangement is configured at least to collect a set of characteristic parameter measurements of data related to characteristics of said plasma capable of providing current during a dechucking step; and
    a detection module, wherein said detection module is configured to compare said set of characteristic parameter measurements against a pre-defined range of data related to characteristics of said plasma capable of providing current, if said set of characteristic parameter measurements is within said pre-defined range, said electrostatic charge is removed from said substrate and said signal perturbation characteristic of said dechucking event is detected.

9. The arrangement of claim 8 wherein said plasma-facing sensor is a capacitively-coupled electrostatic (CCE) probe head.

10. The arrangement of claim 9 wherein said plasma-facing sensor is a small device, wherein a plasma-facing surface of said plasma-facing sensor is made from a material similar to other plasma-facing components of said processing chamber.

11. The arrangement of claim 8 wherein said set of characteristic parameter measurements is a set of ion flux measurements.

12. The arrangement of claim 8 wherein said set of characteristic parameter measurements is a set of electron temperature measurements.

13. The arrangement of claim 8 wherein said set of characteristic parameter measurements is a set of floating potential measurements.

14. The arrangement of claim 8 wherein said detection module is a software algorithm.

15. The arrangement of claim 8 wherein if said detection module is unable to determine said removal of said electrostatic charge from said substrate, corrective actions are applied.

16. An article of manufacture comprising a program storage medium having computer readable code embodied therein, said computer readable code being configured for identifying a signal perturbation characteristic of a dechucking event within a processing chamber of a plasma processing system, comprising:
    code for executing a dechucking step within said processing chamber to remove a substrate from a lower electrode, wherein said dechucking step includes generating a plasma capable of providing a current to neutralize an electrostatic charge on said substrate;

code for employing a probe head to collect a set of characteristic parameter measurements of data related to characteristics of said plasma capable of providing current during said dechucking step, said probe head being on a surface of said processing chamber, wherein said surface is within close proximity to a substrate surface; and code for comparing said set of characteristic parameter measurements against a pre-defined range of data related to characteristics of said plasma capable of providing current, if said set of characteristic parameter measurements is within said pre-defined range, said electrostatic charge is removed from said substrate and said signal perturbation characteristics of said dechucking event is detected.

17. The article of manufacture of claim 16 wherein said probe head is a capacitively-coupled electrostatic (CCE) probe.

18. The article of manufacture of claim 16 wherein said set characteristic parameter measurements is one of a set of ion flux measurements, a set of electron temperature measurements, and a set of floating potential measurements.

19. The article of manufacture of claim 16 wherein if said set of characteristic parameter measurements is not within said pre-defined range, said electrostatic charge is not neutralized and said dechucking event is not terminated.

20. The article of manufacture of claim 16 wherein said code for comparing of said set of characteristic parameter measurements against said pre-defined range is performed by a detection module.

* * * * *

UNITED STATES PATENT AND TRADEMARK OFFICE
CERTIFICATE OF CORRECTION

PATENT NO.        : 8,780,522 B2
APPLICATION NO.   : 12/498939
DATED             : July 15, 2014
INVENTOR(S)       : Jean-Paul Booth It is certified that error appears in the above-identified patent and that said Letters Patent is hereby corrected as shown below:

On the Title Page, References Cited

Page 2, Column 2,
Other Publications, Line 18:     Delete "international" and insert --International--

Page 2, Column 2,
Other Publications, Line 30:     Delete "international" and insert --International--

Page 2, Column 2,
Other Publications, Line 34:     Delete "Issues" and insert --Issued--

Page 2, Column 2,
Other Publications, Line 40:     Delete "Patentabty" and insert --Patentability--

Page 2, Column 2,
Other Publications, Line 48:     Delete "Finai" and insert --Final--

Page 2, Column 2,
Other Publications, Line 50:     Delete "Finai" and insert --Final--

In the Specification

Column 1, Background of the
Invention, Line 19:              Delete "Dining" and insert --During--

Column 1, Background of the
Invention, Line 27:              Delete "substrate," and insert --substrate--

Signed and Sealed this
Third Day of February, 2015

Michelle K. Lee
*Deputy Director of the United States Patent and Trademark Office*

CERTIFICATE OF CORRECTION (continued)
U.S. Pat. No. 8,780,522 B2

Column 4, Detailed Description
Of Embodiments, Line 32:         Delete "election" and insert --electron--

Column 5, Detailed Description
Of Embodiments, Line 50:         Delete "tins" and insert --this--

Column 6, Detailed Description
Of Embodiments, Line 45:         Delete "A-104" and insert --4-104--

Column 6, Detailed Description
Of Embodiments, Line 52:         Delete "A-108" and insert --4-108--

Column 7, Detailed Description
Of Embodiments, Line 4:         Delete "4-11," and insert --4-114,--

Column 9, Detailed Description
Of Embodiments, Line 46:         Delete "election" and insert --electron--

Column 10, Detailed Description
Of Embodiments, Line 57:         After "FIG.", insert --9A--

Column 11, Detailed Description
Of Embodiments, Line 56:         Delete "election" and insert --electron--